US011195584B1

(12) United States Patent
Hu

(10) Patent No.: US 11,195,584 B1
(45) Date of Patent: Dec. 7, 2021

(54) FLASH MEMORY DEVICE AND BIT LINE CHARGING METHOD THEREOF

(71) Applicant: MACRONIX International Co., Ltd., Hsinchu (TW)

(72) Inventor: Chih-Ting Hu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/888,233

(22) Filed: May 29, 2020

(51) Int. Cl.
*G11C 16/06* (2006.01)
*G11C 16/24* (2006.01)
*G11C 16/04* (2006.01)
*G11C 16/08* (2006.01)
*G11C 16/10* (2006.01)
*G11C 16/30* (2006.01)

(52) U.S. Cl.
CPC .......... *G11C 16/24* (2013.01); *G11C 16/0483* (2013.01); *G11C 16/08* (2013.01); *G11C 16/10* (2013.01); *G11C 16/30* (2013.01)

(58) Field of Classification Search
CPC ..... G11C 16/24; G11C 16/08; G11C 16/0483; G11C 16/10; G11C 16/30
USPC .................................................... 365/185.17
See application file for complete search history.

(56) References Cited

U.S. PATENT DOCUMENTS

2009/0251962 A1* 10/2009 Yun .................... G11C 16/3418 365/185.02
2018/0190363 A1* 7/2018 Lee .................... G11C 16/0483

* cited by examiner

*Primary Examiner* — Tha-O H Bui
(74) *Attorney, Agent, or Firm* — J.C. Patents

(57) ABSTRACT

A flash memory device includes a memory string, a selection switch, a first power source and a second power source. The memory string has a plurality of memory cells. A first memory cell in the memory string is coupled to a first word line, and the first word line is selected to be a programmed word line and the first memory cell is selected to be an inhibited cell, during a first time period, the selection switch is turned on according to a selection signal, and the first power source pulls up voltages on the global bit line and the local bit line to a first voltage. During a second time period, the selection switch is turned-off according to the selection signal, a word line voltage on the first word line is pulled up to pump up the voltage on the local bit line to a second voltage.

15 Claims, 5 Drawing Sheets

FLASH MEMORY DEVICE AND BIT LINE CHARGING METHOD THEREOF

BACKGROUND OF THE INVENTION

1. Field of the Invention

The present invention generally relates to a flash memory device, in particular, to a bit line charging method for the flash memory device.

2. Description of Related Art

In a conventional NAND flash memory is organized into a plurality of blocks, which are programmable and erasable. For providing signals with higher voltage, some charge pump circuits are needed to be disposed on-chip. The charge pump circuits occupy chip area and thereby increases chip size and cost. Thus, the flash memory devices suffer inefficiencies power resulting from their operation schemes in low power system. Also, an exposure of unselected memory cell should not be programmed in a program sequence. A bit line voltage should be well set to inhibit a memory cell which is not programmed.

SUMMARY OF THE INVENTION

The present invention provides a flash memory device and a bit line charging method thereof for well inhibiting a memory cell which is not programmed on a programmed word line.

The flash memory device includes a memory string, a selection switch, a first power source and a second power source. The memory string having a plurality of memory cells. The selection switch is coupled between a local bit line of the memory string and a global bit line. The first power source is coupled to the global bit line. The second power source is couple to a source line of the memory string. Wherein, a first memory cell in the memory string is coupled to a first word line, and the first word line is selected to be a programmed word line and the first memory cell is selected to be an inhibited cell. During a first time period, the selection switch is turned on according to a selection signal, and the first power source pulls up voltages on the global bit line and the local bit line to a first voltage. During a second time period, the selection switch is turned-off according to the selection signal, a word line voltage on the first word line is pulled up to pump up the voltage on the local bit line to a second voltage.

The bit line charging method is adapted for a memory string in a flash memory device. The bit line charging method includes: selecting a first word line to be a programmed word line, and selecting a first memory cell coupled to the first word line to be an inhibited cell; during a first time period, turning on a selection switch to coupled a local bit line of the memory string to a global bit line and pulls up voltages on the global bit line and the local bit line to a first voltage by a first power source; and during a second time period, turning off the selection switch, and pulling up a word line voltage on the first word line to pump up the voltage on the local bit line to a second voltage, wherein the first time period is before the second time period.

Based on the above, presented disclosure provides the first power source to pull up the voltages on the local bit line and the global bit line simultaneously. Then, during a programming time period, a connection between the local bit line and the global bit line is turned-off and the voltage on the local bit line can be pumped up to a higher voltage to inhibit the corresponding memory cell. That is, the flash memory device in presented disclosure needs not provide an extra power source to generate the higher voltage. A circuit size of the flash memory device can be reduced, and an efficiency of the flash memory device can be enhanced.

In order to make the aforementioned and other objectives and advantages of the present invention comprehensible, embodiments accompanied with figures are described in detail below.

DESCRIPTION OF THE EMBODIMENTS

Figure 1:
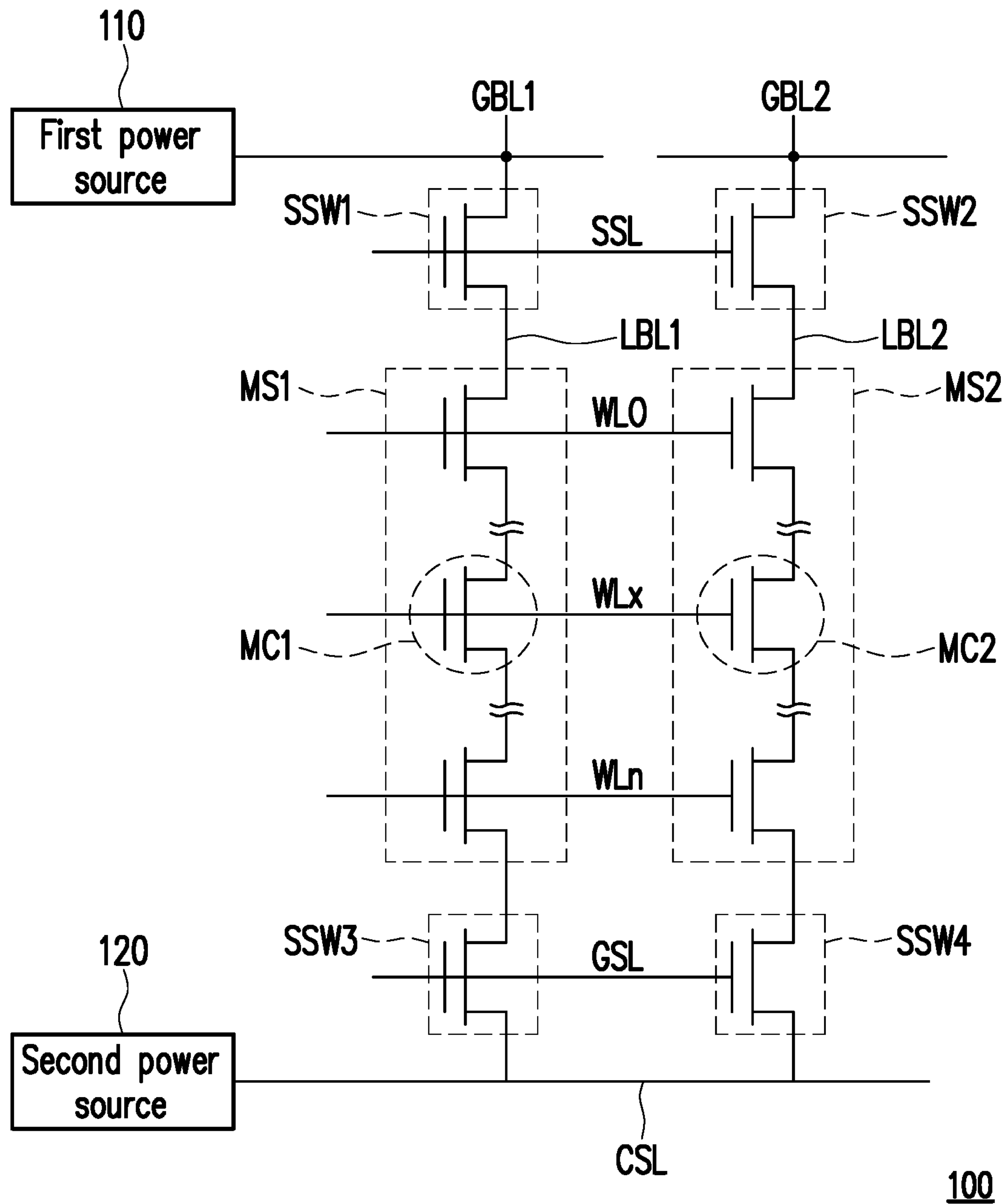
FIG. 1 is a circuit diagram of a flash memory device according to an embodiment of present disclosure.

Please refer to FIG. 1, which is a circuit diagram of a flash memory device according to an embodiment of present disclosure. The flash memory device 100 includes memory strings MS1 and MS2, selection switches SSW1 and SSW2, a first power source 110 and a second power source 120. Each of the memory strings MS1 and MS2 has a plurality of memory cells, and the memory cells are respectively coupled to a plurality of word lines WL0~WLn. The memory string MS1 is coupled to a local bit line LBL1 and the memory string MS2 is coupled to a local bit line LBL2. The selection switch SSW1 is coupled between a global bit line GBL1 and the local bit line LBL1, and the selection switch SSW2 is coupled between the global bit line GBL2 and the local bit line LBL2. The selection switches SSW1 and SSW2 receive a selection signal SSL, and are turned on or turned-off according to the selection signal SSL. Besides, the memory string MS1 is coupled to a source line CSL through a switch SSW3, and the memory string MS2 is coupled to the source line CSL through a switch SSW4. The switches SSW3 and SSW4 receive a selection signal GSL and are turned on or turned-off according to the selection signal GSL. The source line CSL is a common source line of the memory strings MS1 and MS2.

Besides, the first power source 110 and the second power source 120 are respectively coupled to the global bit line GBL and the source line CSL, and are configured to adjust voltages on the global bit line GBL and the source line CSL, respectively.

Figure 2:
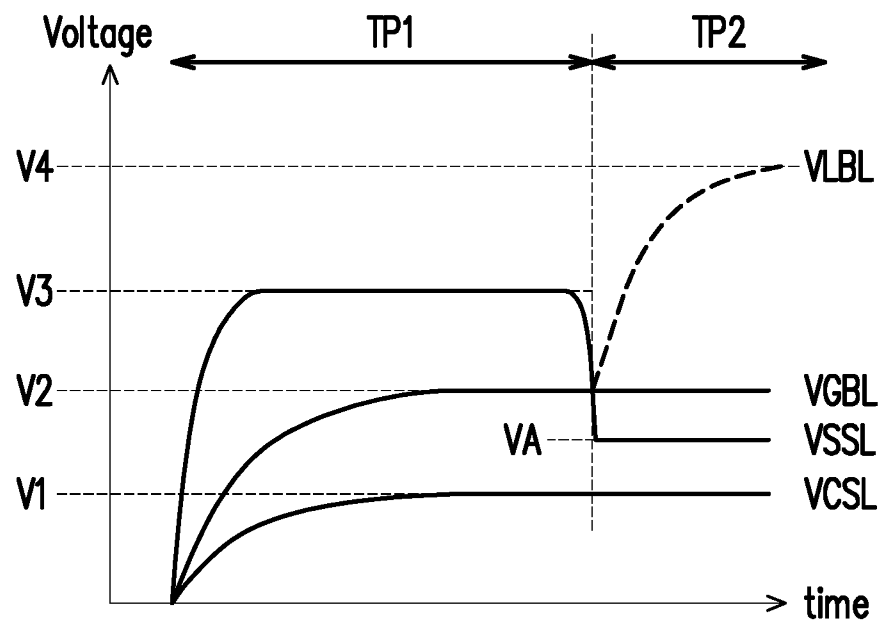
FIG. 2 is a waveform plot of the flash memory device according to an embodiment of present disclosure.

Please refer to FIG. 1 and FIG. 2 commonly, wherein FIG. 2 illustrates a waveform plot of the flash memory device according to an embodiment of present disclosure. When a program operation is performed on the flash memory device 100, a memory cell MC2 of the memory string MS2 is selected to be a programmed cell and the word line WLx coupled by the memory cell MC2 is selected to a programmed word line. Besides, the word line WLx is also coupled to a memory cell MC1 of the memory string MS1, and the memory cell MC1 is selected to be an inhibited cell.

In the FIG. 2, during a time period TP1, a voltage setup scheme may be performed on the flash memory device 100. In detail, during the time period TP1, the selection switch SSW1 is turned on, and the voltages VGBL and VLBL on the global bit line GBL1 and the local bit line LBL1 are pulled up to a voltage V2 by the first power source 110. In here, a voltage VSSL on the selection signal SSL is pulled up to a voltage V3 for turning on the selection switch SSW1. In this embodiment, the voltage V3 is higher than the voltage V2. On the other hand, during the time period TP1, the selection switch SSW1 is turned on according to the selection signal SSL. Also, a voltage VCSL on the source line CSL can be pulled up to a voltage V1 by the second power source 120 during the time period TP1, where the voltage V1 is lower than the voltage V2.

After the time period TP1, during a time period TP2, a program scheme can be performed. During the time period TP2, the voltage VSSL of the selection signal SSL is pulled down to a voltage VA to turn-off the selection switch SSW1. Since the selection switch SSW1 is turned-off, the first power source 110 no more drives the local bit line LBL1, and the local bit line LBL1 is in a floating status. On the other hand, a voltage on the word line WLx can be pulled up for programming the programmed cell (the memory cell MC2), and the voltage VLBL on the local bit line LBL1 can be pumped up to a higher voltage V4 caused by a capacitor between the local bit line LBL1 and the word line WLx, wherein the capacitor is formed through a coupling effect between the local bit line LBL1 and the word line WLx. Such as that, the memory cell MC1 can be well inhibited. In this embodiment, the voltage VA is lower than the voltage VGBL, and higher than the voltage VCSL.

In present embodiment, during the time period TP2, the voltages VGBL and VCSL are held on the voltage V2 and V1, respectively.

Please be noted here, the first power source 110 may be a sense amplifier, a low dropout (LDO) voltage regulator or any other power generator well known by a person skilled in the art. The second power source 120 may be a LDO voltage regulator or any other power generator well known by a person skilled in the art. In this embodiment, a voltage of an operation power of the first power source 110 may be higher than the voltage V2. Furthermore, the voltages V1 and V2 may be 1.3V and 1.8V respectively, and not limited thereto.

Figure 3:
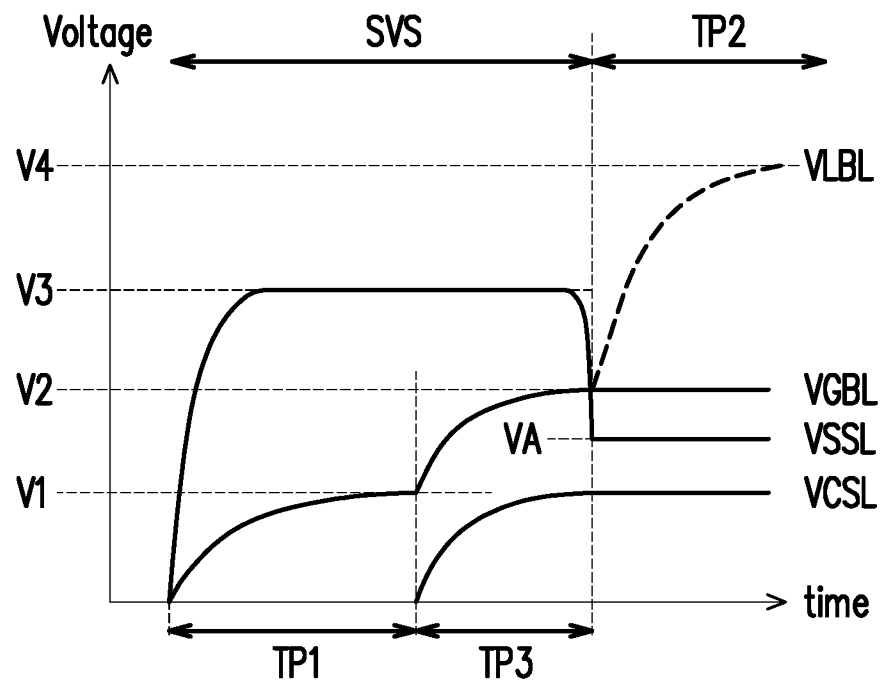
FIG. 3 illustrates a waveform plot of the flash memory device according to another embodiment of present disclosure.

Please refer to FIG. 1 and FIG. 3 commonly, wherein FIG. 3 illustrates a waveform plot of the flash memory device according to another embodiment of present disclosure. In FIG. 3, similar to the embodiment of FIG. 2, a memory cell MC2 of the memory string MS2 is selected to be a programmed cell and the word line WLx coupled by the memory cell MC2 is selected to a programmed word line. Besides, the word line WLx is also coupled to a memory cell MC1 of the memory string MS1, and the memory cell MC1 is selected to be an inhibited cell.

In FIG. 3, a voltage setup scheme SVS can be divided into two time periods TP1 and TP3. During the time period TP1, the selection switch SSW1 is turned on according to the selection signal SSL, and voltages VLBL and VGBL of the local bit line LBL1 and the global bit line GBL1 can be pulled up to a voltage V1 by the first power source 110 simultaneously. During the time period TP1, a voltage VCSL on the source line CSL is held on a reference ground voltage (i.e. 0V).

After the time period TP1, during the time period TP3, the voltage VCSL on the source line CSL is pulled up to the voltage V1 gradually by the second power source 120. Correspondingly, the voltage VGBL on the global bit line GBL and the voltage VLBL on the local bit line LBL1 are charged up simultaneously to a voltage V2 through capacitor between the source line CSL and the global bit line GBL1. After the time period TP3, during a time period TP2, a program scheme can be performed.

During the time period TP2, a voltage VSSL of the selection signal SSL is pulled down to a voltage VA, and the selection switch SSW1 is turned-off accordingly. Such as that, the local bit line LBL1 and the global bit line GBL1 are isolated, and the local bit line LBL1 is no more driven by the first power source 110 and is in a floating status.

On the other hand, during the time period TP2, a voltage on the word line WLx can be pulled up for programming the programmed cell (the memory cell MC2), and the voltage VLBL on the local bit line LBL1 can be pumped up to a higher voltage V4 caused by a capacitor formed between the local bit line LBL1 and the word line WLx by a coupling effect. Such as that, the memory cell MC1 can be well inhibited. In this embodiment, the voltage VA is lower than the voltage VGBL, and higher than the voltage VCSL. Also, in present embodiment, during the time period TP2, the voltages VGBL and VCSL are held on the voltage V2 and V1, respectively.

Please be noted here, the first power source 110 may be a sense amplifier, a low dropout (LDO) voltage regulator or any other power generator well known by a person skilled in the art. The second power source 120 may be a LDO voltage regulator or any other power generator well known by a person skilled in the art. In this embodiment, a voltage of an operation power of the first power source 110 may be lower than or equal to the voltage V2. Furthermore, the voltages V1 and V2 may be 1.3V and 1.8V respectively, and not limited thereto. For example, if the first power source 110 is a LDO voltage generator, an output voltage the first power source 110 may be limited by the operation power. But, in presented embodiment, the voltages VLBL and VGBL are charged up to 1.8V according to the voltage VCSL on the source line CSL during the time period TP3. That is, the voltage of the operation power of the first power source 110 may be smaller than the voltage V2 (=1.8V), and the first power source 110 can be operated in a condition with low operation power.

Figure 4A:
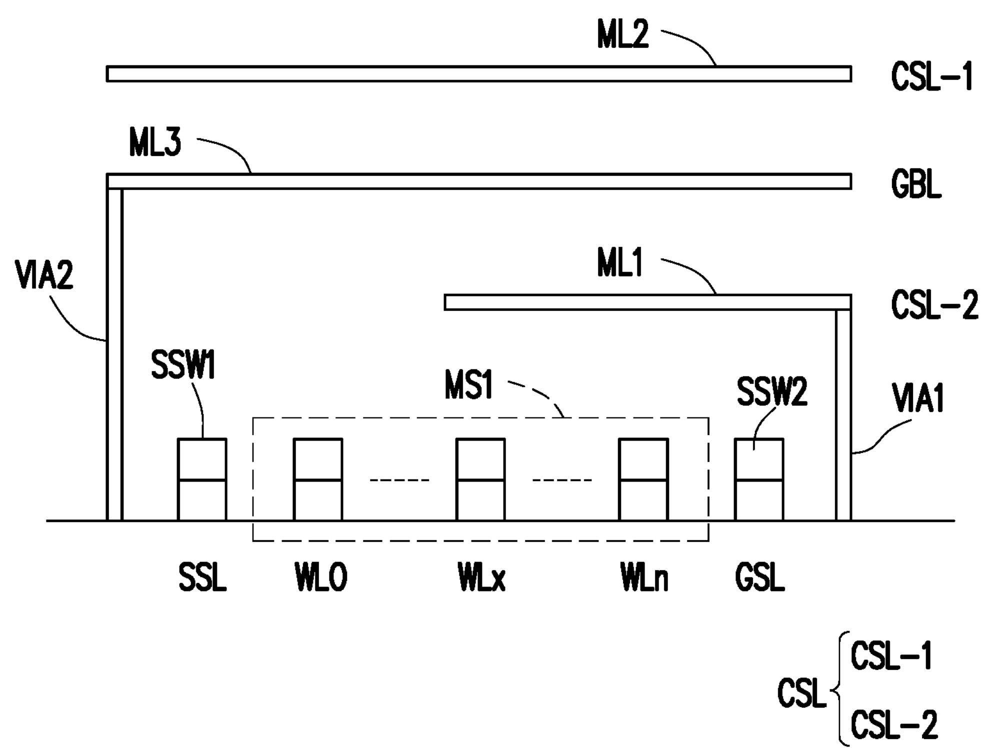
FIG. 4A illustrates a schematic diagram of a hardware structure of a flash memory device according to an embodiment of present disclosure.

Please refer to FIG. 4A, which illustrates a schematic diagram of a hardware structure of a flash memory device according to an embodiment of present disclosure. FIG. 4A is a plot of a cross section of a flash memory device 400. The flash memory device 400 is disposed on a semiconductor substrate. The flash memory device 400 includes a memory string MS1 and selection switch SSW1-SSW2. The memory string MS1 is coupled to word lines WL0-WLn. The selection switch SSW1 is coupled between the memory string MS1 and a global bit line GBL, and the selection switch SSW2 is coupled between the memory string MS1 and a source line CSL. The selection switches SSW1 and SSW2 are respectively controlled by selection signals SSL and GSL.

In this embodiment, the source line CSL may be divided into two parts CSL-1 and CLS-2, and the two parts CSL-1 and CLS-2 can be formed in different metal layers ML1 and ML2, respectively. Furthermore, the global bit line GBL can be formed in another metal layer ML3. In this embodiment, the metal layer ML3 is between the metal layers ML1 and ML2, and there are capacitors can be formed between any two adjacent metal layers (between the metal layers ML1, ML3, and between the metal layers ML3, ML2) by a coupling effect. Through the capacitors mentioned above, a voltage on the global bit line GBL can be charged up by rising a voltage on the source line CSL.

The global bit line GBL can be connected to the selection switch SSW1 through a via VIA2, and the source line CSL can be connected to the selection switch SSW2 through a via VIA1.

Figure 4B:
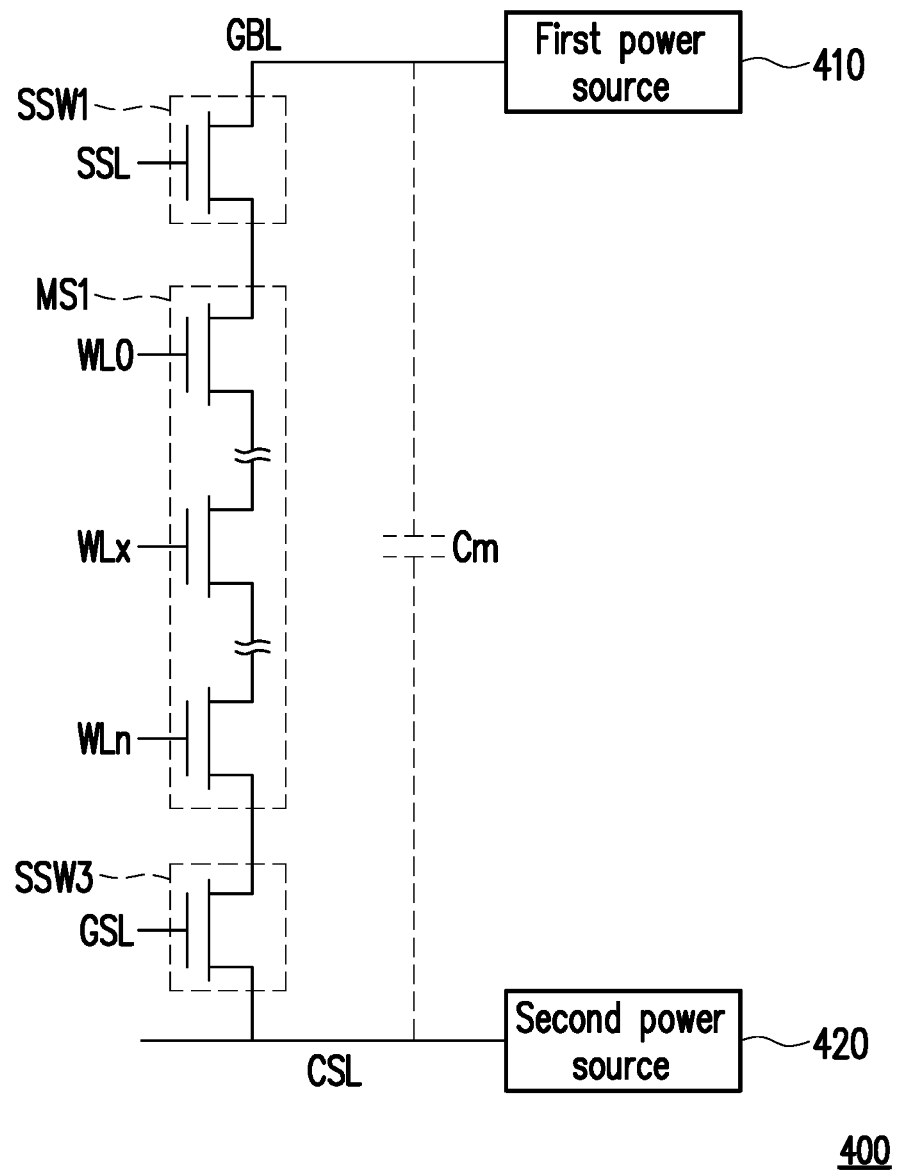
FIG. 4B illustrates an equivalent circuit plot of a flash memory device according to an embodiment of present disclosure.

Please refer to FIG. 4B, which illustrates an equivalent circuit plot of a flash memory device according to an embodiment of present disclosure. In FIG. 4B, a memory string MS1 is included in a flash memory device 400, and the memory string MS1 is coupled to a global bit line GBL through a selection switch SSW1, and coupled to a source line CSL through a switch SSW3. The global bit line GBL and the source line CSL are respectively coupled to a first power source 410 and a second power source 420. The selection switch SSW1 is controlled by a selection signal SSL, the switch SSW3 is controlled by a selection signal, and memory cells of the memory string MS1 are coupled to word lines WL0, WLx and WLn.

By the disclosure in FIG. 4A, it can be seen a capacitor Cm may be formed between the global bit line GBL and the source line CSL by a coupling effect of the global bit line GBL and the source line CSL. When a voltage on the global bit line GBL can affect a voltage on the source line CSL through the capacitor Cm.

Figure 5:
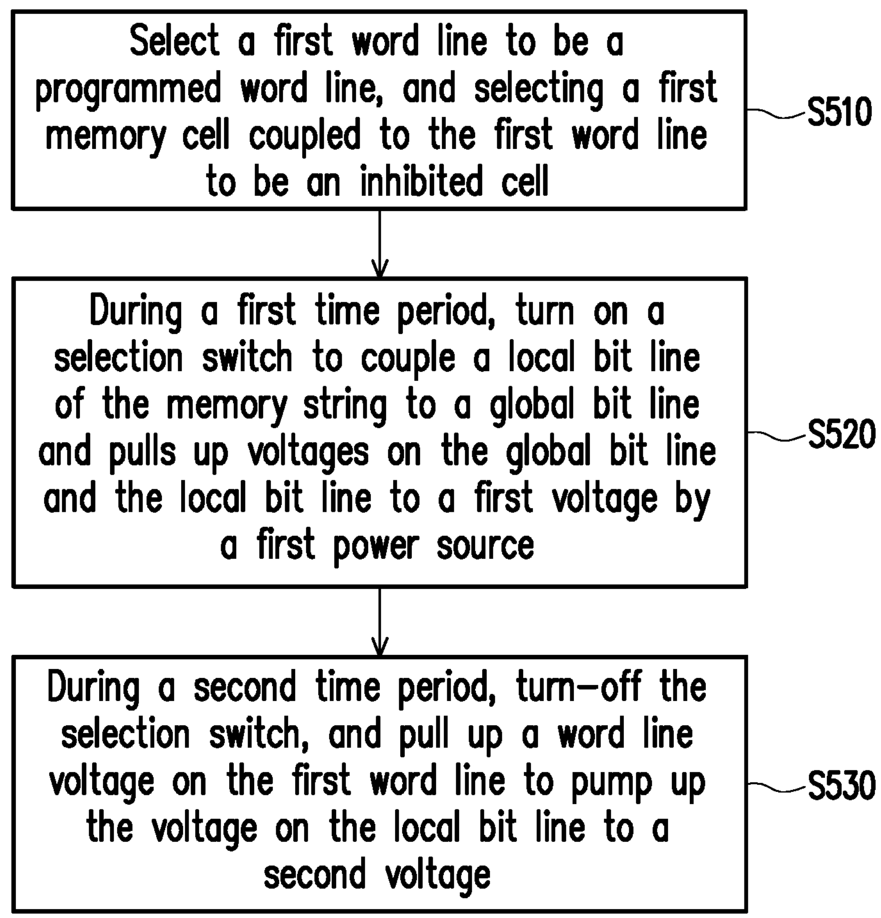
FIG. 5 illustrates a flow chart for a bit line charging method according to an embodiment of present disclosure.

Please refer to FIG. 5, which illustrates a flow chart for a bit line charging method according to an embodiment of present disclosure. The flow chart in FIG. 5 may be adapted for a memory string in a flash memory device, and the flash memory device may be a NAND flash memory device. In a step S510, a first word line is selected to be a programmed word line, and a first memory cell coupled to the first word line is selected to be an inhibited cell. Then, in a step S520, during a first time period, a selection switch is turned on to couple a local bit line of the memory string to a global bit line, and voltages on the global bit line and the local bit line are pulled up to a first voltage by a first power source. In a step S530, during a second time period, the selection switch is turned off, and a word line voltage on the first word line is pulled up to pump up the voltage on the local bit line to a second voltage. In this embodiment, the first time period is before the second time period.

Detail operation of the steps S510-S530 have been described in the embodiments mentioned above, and no more repeated description here.

Based on the above, according to the present invention, the flash memory device charges up voltages on local bit line and/or global bit line by adjacent signal through capacitor formed by a coupling effect therebetween. That is, a powers source with high operation power is not necessary in present disclosure. Power efficiency of the flash memory device can be improved, and a circuit size of the flash memory device can be reduced, too.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A flash memory device, comprising:

a memory string having a plurality of memory cells;

a selection switch, coupled between a local bit line of the memory string and a global bit line;

a first power source, coupled to the global bit line; and a second power source, couple to a source line of the memory string, wherein a first memory cell in the memory string is coupled to a first word line, the first word line is selected to be a programmed word line and the first memory cell is selected to be an inhibited cell, during a first time period, the selection switch is turned on according to a selection signal, and the first power source pulls up voltages on the global bit line and the local bit line to a first voltage; and during a second time period, the selection switch is turned-off according to the selection signal, a word line voltage on the first word line is pulled up to pump up the voltage on the local bit line to a second voltage caused by a capacitor between the local bit line and the first word line, wherein the first time period is before the second time period.

2. The flash memory device according to claim 1, wherein the second power source pulls up a voltage on the source line to a third voltage during the first time period, and holds the voltage on the source line to the third voltage during the second time period, wherein the third voltage is lower than the first voltage.

3. The flash memory device according to claim 2, wherein a voltage of operation power of the first power source is higher than the first voltage.

4. The flash memory device according to claim 1, wherein during the first time period the second power source holds a voltage on the source line on a third voltage, and during a third time period, the second power source pulls up the voltage on the source line to a fourth voltage to charge up the voltages on the local bit line and the global bit line to a fifth voltage, wherein the fourth voltage is lower than the fifth voltage, and the third time period is between the first time period and the second time period.

5. The flash memory device according to claim 4, wherein a voltage of operation power of the first power source is equal to or lower than the fifth voltage.

6. The flash memory device according to claim 1, wherein a voltage of the selection signal is pulled up to a third voltage to turn on the selection switch during the first time period, and the voltage of the selection signal is pulled down to a fourth voltage, to turned-off the selection switch during the second time period, wherein the third voltage is higher than the first voltage, and the fourth voltage is lower than the first voltage.

7. The flash memory device according to claim 1, wherein the source line and the global bit line are disposed on different metal layers.

8. The flash memory device according to claim 1, wherein the source line comprises a first sub-source line and a second sub-source line, the first sub-source line and the second sub-source line are respectively disposed on a first metal layer and a second metal layer, and the global bit line is disposed on a third metal layer, wherein the third metal layer is between the first metal layer and the second metal layer.

9. The flash memory device according to claim 1, further comprising:

a capacitor, formed between the global bit line and the source line by a coupling effect.

10. A bit line charging method, adapted for a memory string in a flash memory device, comprising:

selecting a first word line to be a programmed word line, and selecting a first memory cell coupled to the first word line to be an inhibited cell;

during a first time period, turning on a selection switch to couple a local bit line of the memory string to a global bit line and pulls up voltages on the global bit line and the local bit line to a first voltage by a first power source; and during a second time period, turning off the selection switch, and pulling up a word line voltage on the first word line to pump up the voltage on the local bit line to a second voltage caused by a capacitor between the local bit line and the first word line, wherein the first time period is before the second time period.

11. The bit line charging method, according to claim 10, further comprising:

pulling up a voltage on the source line to a third voltage during the first time period and holding the voltage on the source line to the third voltage during the second time period by a second power source, wherein the third voltage is lower than the first voltage.

12. The bit line charging method, according to claim 11, wherein a voltage of operation power of the first power source is higher than the first voltage.

13. The bit line charging method according to claim 10, further comprising:

holding a voltage on the source line on a third voltage during the first time period by a second power source;

pulling up the voltage on the source line to a fourth voltage to charge up the voltages on the local bit line and the global bit line to a fifth voltage during a third time period by the second power source, wherein the fourth voltage is lower than the fifth voltage, and the third time period is between the first time period and the second time period.

14. The bit line charging method according to claim 13, wherein a voltage of operation power of the first power source is equal to or lower than the fifth voltage.

15. The bit line charging method according to claim 10, further comprising:

pulling up a voltage of the selection signal to a third voltage to turn on the selection switch during the first time period; and pulling down the voltage of the selection signal to a fourth voltage to turn-off the selection switch during the second time period, wherein the third voltage is higher than the first voltage, and the fourth voltage is lower than the first voltage.

* * * * *